United States Patent
Thet et al.

(10) Patent No.: US 8,420,530 B2
(45) Date of Patent: Apr. 16, 2013

(54) NANO-INTERCONNECTS FOR ATOMIC AND MOLECULAR SCALE CIRCUITS

(75) Inventors: Naing Tun Thet, Singapore (SG); Christian Joachim, Lagardelle (FR); Natarajan Chandrasekhar, Bangalore (IN)

(73) Assignee: Agency for Science, Technology and Research, Connexis (SG)

( * ) Notice: Subject to any disclaimer, the term of this patent is extended or adjusted under 35 U.S.C. 154(b) by 189 days.

(21) Appl. No.: 12/672,885

(22) PCT Filed: Aug. 10, 2007

(86) PCT No.: PCT/SG2007/000247
§ 371 (c)(1), (2), (4) Date: Sep. 13, 2010

(87) PCT Pub. No.: WO2009/022982
PCT Pub. Date: Feb. 19, 2009

(65) Prior Publication Data
US 2011/0018138 A1    Jan. 27, 2011

(51) Int. Cl.
*H01L 21/4763* (2006.01)
*H01L 21/44* (2006.01)
*H01L 23/48* (2006.01)

(52) U.S. Cl.
USPC ............... 438/637; 257/774; 257/E21.577; 257/21.585; 438/688

(58) Field of Classification Search .............. 257/773, 257/774, E21.575, E23.169, E21.577, E21.585; 438/618, 619, 624, 638, 667, 637, 668
See application file for complete search history.

(56) References Cited

U.S. PATENT DOCUMENTS

| | | | | |
|---|---|---|---|---|
| 5,122,856 | A * | 6/1992 | Komiya | 257/774 |
| 7,834,461 | B2 * | 11/2010 | Asai et al. | 257/774 |
| 2004/0056307 | A1 | 3/2004 | Cho et al. | |
| 2004/0224501 | A1 | 11/2004 | Lo et al. | |
| 2005/0059204 | A1 | 3/2005 | Heschel | |
| 2007/0029620 | A1 | 2/2007 | Nowak | |
| 2008/0093743 | A1 * | 4/2008 | Yang et al. | 257/758 |

FOREIGN PATENT DOCUMENTS

| | | |
|---|---|---|
| EP | 0 316 799 A1 | 5/1989 |
| EP | 0 391 562 A2 | 10/1990 |
| EP | 1 195 808 A1 | 4/2002 |
| JP | 55-12766 | 1/1980 |
| JP | 2005-353997 A | 12/2005 |
| WO | WO-94/17553 A1 | 8/1994 |

OTHER PUBLICATIONS

"Design considerations and performance of a combined scanning tunneling and scanning electron microscope", Weissner et al. pp. 3790-3798, Mar. 1997.*
Torre et al., "Fabrication of Nanoelectrodes for Hybrid Molecular-Electronic Devices," 2004 4th IEEE Conference on Nanotechnology, 2004, pp. 456-458.
International Search Report and Written Opinion mailed Oct. 5, 2007 in International application No. PCT/SG2007/000247.
Supplemental European Search Report dated Dec. 5, 2011 as received in corresponding European Application No. 07794259.7, 12 pages.

* cited by examiner

*Primary Examiner* — Jasmine Clark
(74) *Attorney, Agent, or Firm* — Foley & Lardner LLP

(57) ABSTRACT

A method for forming interconnects in a substrate, the substrate comprising a semiconductor layer on an oxide layer forming a silicon-on-oxide substrate, the method comprising forming a plurality of holes into the substrate to the semiconductor layer, and metalizing the plurality of holes to form the interconnects.

32 Claims, 5 Drawing Sheets

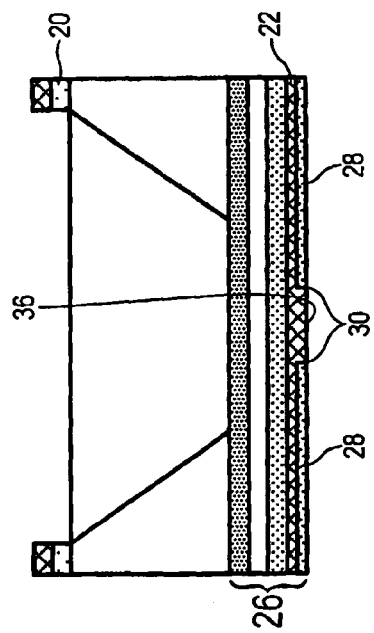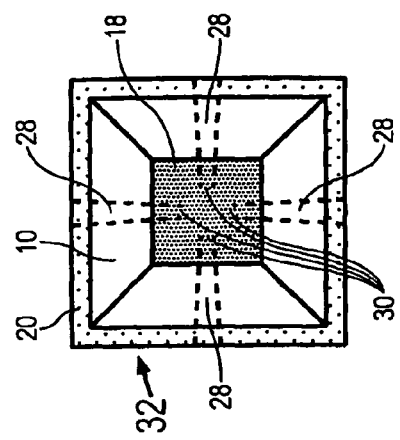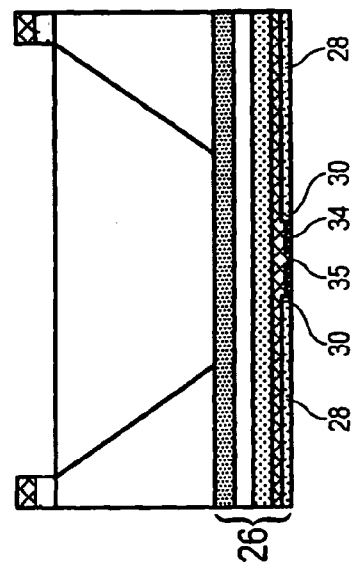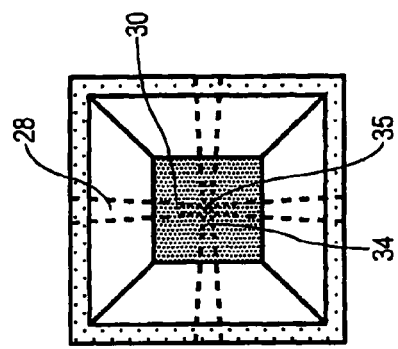

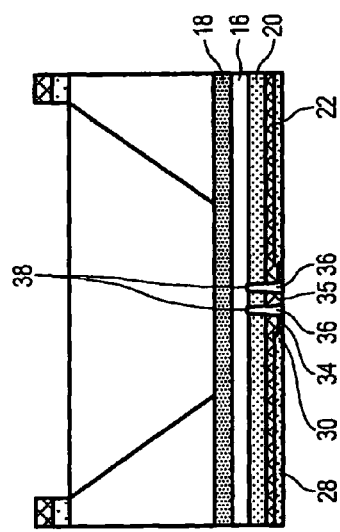
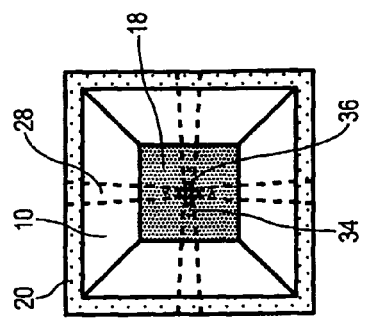
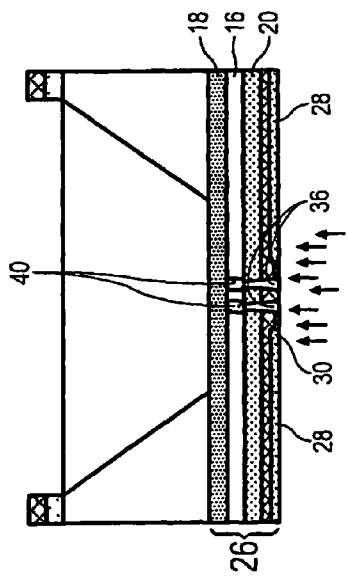
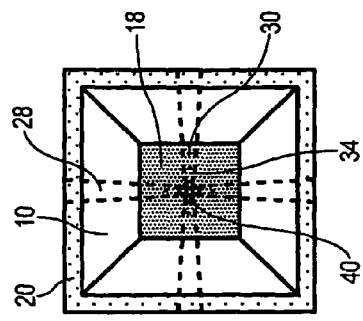

NANO-INTERCONNECTS FOR ATOMIC AND MOLECULAR SCALE CIRCUITS

CROSS-REFERENCE TO RELATED APPLICATIONS

This application is a National Stage application of PCT/SG2007/000247, filed Aug. 10, 2007, which is incorporated by reference herein in its entirety.

TECHNICAL FIELD

This invention relates to interconnects for, and a method for interconnecting, one or more of: atomic scale circuits, molecular devices and uni-molecular circuits; and relates more particularly, though not exclusively, to such interconnects and method where interconnects are fabricated while being supported by a substrate for the circuits.

BACKGROUND

Interconnects of atomic and/or molecular devices, and of uni-molecular circuits, require a fully planar and ultra clean technology with a precision that is at the atomic scale. This has not been able to be solved by the use of known nano-lithography techniques. Nano-imprint and E-Beam Nano-lithography use organics which pollute the supporting surface of the atomic and/or molecular devices, or intra-molecular circuits. Furthermore, they do not reach a precision that is at the atomic scale. Nanostencil (dynamic and static) avoids the pollution problem but is not atomic in its scale. Furthermore, none of these can provide an atomically flat supporting surface after the process. Finally, the usual surface cleaning procedures normally destroy the result obtained by nano-lithography.

SUMMARY

According to an exemplary aspect there is provided a method for forming interconnects in a substrate, the substrate comprising a semiconductor layer on an oxide layer forming a silicon-on-oxide substrate, the method comprising forming a plurality of holes into the substrate to the semiconductor layer, and metalizing the plurality of holes to form the interconnects.

According to another exemplary aspect there is provided interconnects for atomic, molecular and uni-molecular circuits on a substrate, the substrate comprising a semiconductor layer on an oxide layer forming a silicon-on-oxide substrate, the interconnects comprising a plurality of metalized holes formed in the substrate from a side thereof to doped portions of the semiconductor layer.

According to a further exemplary aspect there is provided a method for doping a semiconductor layer in a substrate, the substrate comprising a semiconductor layer on an oxide layer forming a silicon-on-oxide substrate, the method comprising forming a plurality of holes into the substrate to the semiconductor layer and doping portions of the semiconductor layer through the plurality of holes. The method may further comprise subsequently metalizing the plurality of holes to form interconnects.

For all aspects, the holes may be formed from a second side of the substrate. Prior to metallization, portions of the semiconductor layer may be doped through the plurality of holes. Prior to forming the plurality of holes, the semiconductor layer may have formed thereon a layer of a thermal oxide and a layer of a dielectric. Prior to forming the plurality of holes, but after forming the dielectric layer, a plurality of buried metal electrodes may be formed in the dielectric layer. Each buried metal electrode may have an inner end. The inner ends may face each other and there may be a gap between them. The dielectric may remain between the plurality of buried metal electrodes, and between the inner ends. Nano-electrodes may be formed on the inner ends and may extend towards each other with a nano-gap therebetween. The plurality of holes may be formed through the nano-electrodes, the dielectric layer and the thermal oxide layer.

Doping may be by use of a focused ion beam. A window may be opened from a first side of the substrate and may extend to the oxide layer. The first side may be opposite the second side. The window may be formed prior to the buried metal electrodes being formed. A portion of the oxide layer adjacent the doped portions of the semiconductor layer may be removed through the window and may expose a surface of the semiconductor layer. A circuit may be formed on the exposed surface of the semiconductor layer adjacent the doped portions. The circuit may be selected from: atomic scale, molecular scale and nano-scale. The window may be at least partially filled by wafer bonding to package the circuit.

The plurality of holes may be formed through the window from an exposed surface of the oxide layer. A plurality of upper electrodes may be formed on the window surfaces from the first side. The holes may be formed through the plurality of upper electrodes. A circuit may be formed on an exposed surface of the semiconductor layer adjacent the doped portions. The circuit may be selected from: atomic scale, molecular scale and nano-scale.

A second layer of dielectric may be formed over the plurality of buried metal electrodes. The second layer of dielectric may be removed from outer ends of the plurality of buried metal electrodes to provide probe landings.

The holes may be of a diameter in the range 10 to 100 nm or 30 to 50 nm. The interconnects may be mechanically supported by the substrate; and the use of detrimental chemicals is avoided. The atomic scale cleanliness of the exposed surface of the semiconductor layer may be maintained.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings.

In the drawings:

FIG. 3 is an illustrative view of the exemplary embodiment at a third stage of the method depicting the making of four buried Au micro-electrodes in the $Si_3N_4$ layer by photolithography with (a) being a vertical cross-sectional view and (b) being a top plan view;

FIG. 4 is an illustrative view of the exemplary embodiment at a fourth stage of the method depicting the making of four buried Au nano-electrodes at the ends of microelectrodes in the Si₃N₄ layer by Focused Ion Beam ("FIB") or nano-stencil lithography with (a) being a vertical cross-sectional view and (b) being a top plan view;

FIG. 5 is an illustrative view of the exemplary embodiment at a fifth stage of the method depicting the use of FIB to form holes at the ends of four nano-electrodes until the ends of the holes enter the SOI layer with (a) being a vertical cross-sectional view and (b) being a top plan view;

FIG. 6 is an illustrative view of the exemplary embodiment at a sixth stage of the method depicting ion implantation (doping) of the SOI layer at the end of the holes with (a) being a vertical cross-sectional view and (b) being a top plan view;

DETAILED DESCRIPTION OF THE PREFERRED EMBODIMENTS

Figure 1:
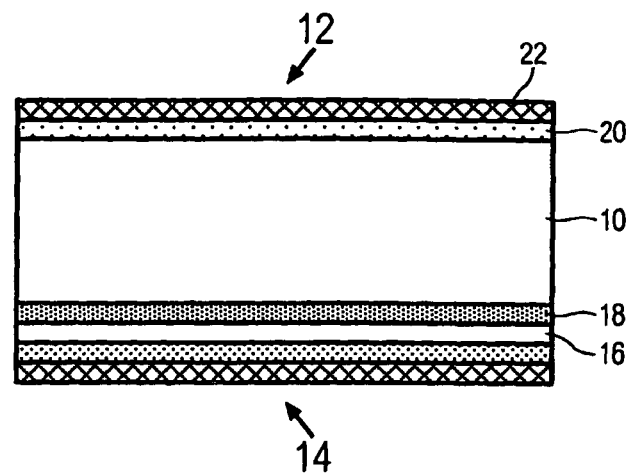
FIG. 1 is an illustrative vertical cross-sectional view of an exemplary embodiment at a first stage of the method depicting the use of low pressure chemical vapour deposition ("LPCVD") to grow $Si_3N_4$ and thermal $SiO_2$ on both sides of a wafer of silicon-on-insulator ("SOI") wafer.

As shown in FIG. 1, at the commencement of the process there is substrate 10 having a first side 12 and a second side 14. The substrate 10 may be any suitable inorganic semiconductor substrate such as, for example, silicon and may be of any suitable thickness. On the second side 14 the substrate 10 there is an undoped semi-conductor or a semi-conductor material 16 on the surface of an oxide 18 such that the substrate 10 is a silicon-on-insulator ("SOP") substrate. The material 16 preferably is a large band gap material and may act to mechanically stabilize the position of interconnects to be fabricated, as will be described below.

On both sides 12, 14 of the SOI substrate 10 is grown at least one dielectric layer such as, for example, a layer 22 of $Si_3N_4$, $SiO_2$ or any other compatible oxide or dielectric material, preferably grown by low pressure chemical vapour deposition ("LPCVD") over a thin layer 20 of a thermal oxide such as, for example, $SiO_2$. The SOI substrate may be fabricated by Smart-Cut or any other technique. In this method the thin silicon layer 20 of $SiO_2$ is isolated from bulk of the silicon substrate 10 by the buried oxide layer 18, and is sandwiched between the dielectric layers 20, 22.

Figure 2A:
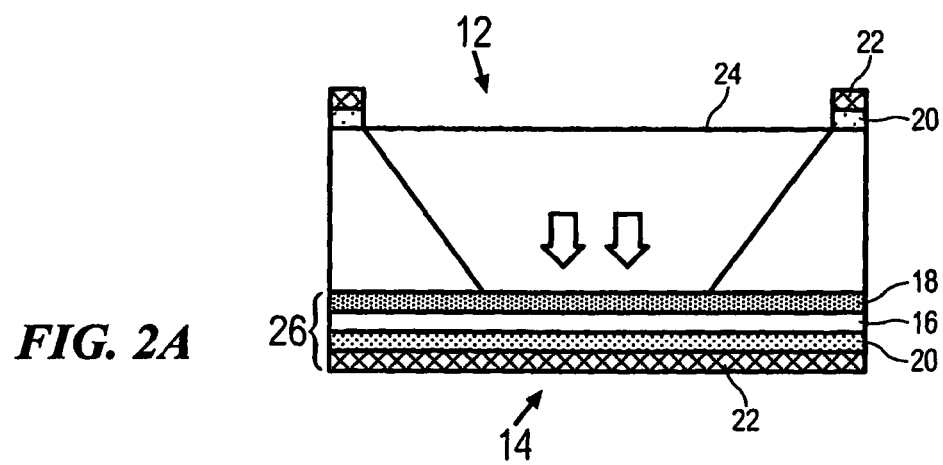
FIG. 2 is an illustrative view of the exemplary embodiment at a second stage of the method depicting the forming of front side windows and KOH etching of bulk substrate down to buried oxide layer with (a) being a vertical cross-sectional view and (b) being a top plan view.
Figure 2B:
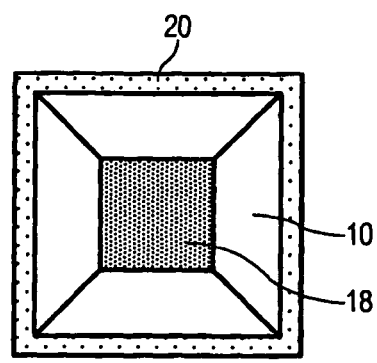

In FIG. 2 a window 24 is opened in the dielectric layers 20, 22 from the first side 12 by selective etching to enable further fabrication. Etching is preferably by using potassium hydroxide (KOH) and more preferably normally stops at the buried oxide layer 18 resulting in a thin SOI membrane 26.

As shown in FIG. 3, by using nano-stencil or equivalent lithography, buried metal micro-electrodes 28 are fabricated with the ends 30 of the electrodes 28 facing one another on the SOI membrane 26, with the gap 36 between the ends 30 being a few microns. The dielectric layer 22 remains between the electrodes 28, and between the ends 30 of the electrodes 28. There may be any suitable number of electrodes 28 (four as shown) and they are preferably equally spaced. More preferably, they are arranged with their longitudinal axes substantially perpendicular (although they do not intersect). The electrodes 28 preferably extend from the outer edges 32 of the thin SOI membrane 26 towards its centre. The thin SOI membrane 26 may be of any suitable shape such as, for example, square as shown. In that case the electrodes may extend from the centres of each edge 32 of the thin SOI membrane 26. The fabrication of the micro-electrodes 28 is such that the electrodes 28 are buried within and/or into the dielectric layer 22 of the second side 14.

To refer to FIG. 4, by using nano-patterning methods such as, for example nano-stencil, focused ion beam)("FIB") or masking, buried nano-electrodes 34 are fabricated that extend axially beyond the ends 30 of micro-electrodes 28 towards each other but not intersecting or contacting each other to thus leave a nanometer scale gap 35 between the ends 30. As such the nano-electrodes 34 are somewhat cruciform or star shaped but without actually intersecting or contacting each other. Other shapes are possible depending on final geometry designed.

In FIG. 5 is shown the next step in the method. Here, by using the FIB technique or etching, holes 36 are formed completely through the nano-electrodes 34 adjacent the innermost end of the electrodes 34. As shown there are four holes 36 equally spaced around gap 35. Each hole 36 has a diameter that is preferably in the range 10 to 100 nm, more preferably 30 to 50 nm. Each hole 36 passes from the nano-electrode 34 and into but not through the thin semiconductor layer 16 to expose a small portion 38 of the semiconductor layer 16 to the second side 14, each small portion 38 being accessible from the second side 14 through the holes 36. The holes 36 may be somewhat conical as shown, substantially cylindrical, or any other suitable, desired or required shape. FIG. 6 shows that the small portion 38 of the SOI layer 16 is doped from the second side 14 thorough the holes 36 again using FIB, direct ion implantation, or a similar technique, to form a doped portion 40 for each electrode 34.

Figure 7B:
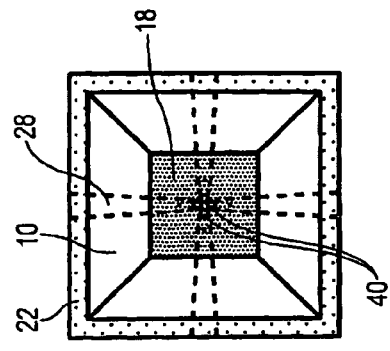
FIG. 7 is an illustrative view of the exemplary embodiment at a seventh stage of the method depicting the filling of the holes with a conductive metal with (a) being a vertical cross-sectional view and (b) being a top plan view.
Figure 7A:
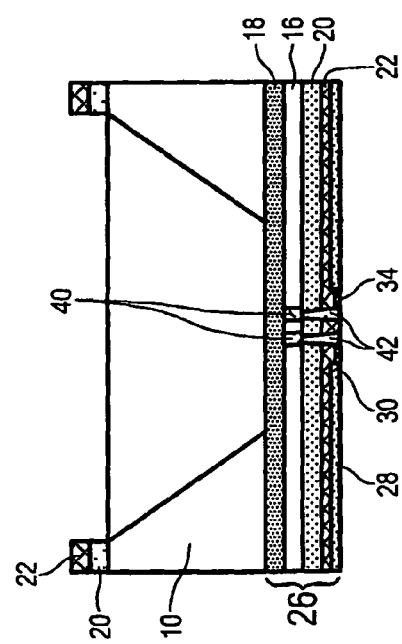

In FIG. 7, and after the formation of the doped portion 40, each hole 36 is metalized or filled with a conductive metal 42 such as, for example, platinum (Pt) down to the doped portions 40. This may be by using FIB with an organo-metallic gas, or an equivalent technique. The metallization 42 provides interconnects that have a small electrical resistance and that extend from the SOI layer 16 to the second side 14. The conductive metal 42 is supported by the material of the membrane 26. The conductive metal 42 may substantially fully fill the holes 36.

Figure 8:
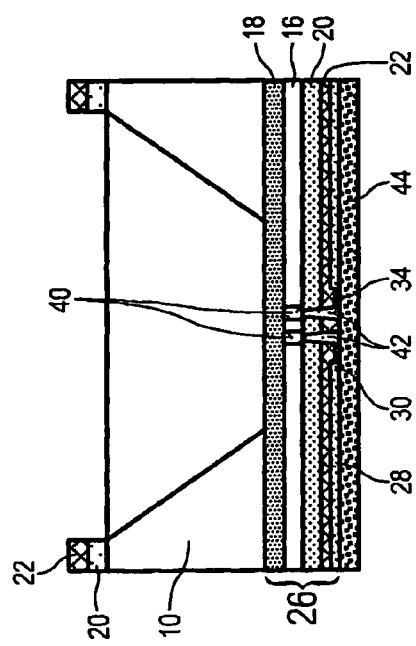
FIG. 8 is an illustrative vertical cross-sectional view of the exemplary embodiment at an eighth stage of the method depicting the growing of a protective $Si_3N_4$ layer onto the surface of electrode patterns.
Figure 9:
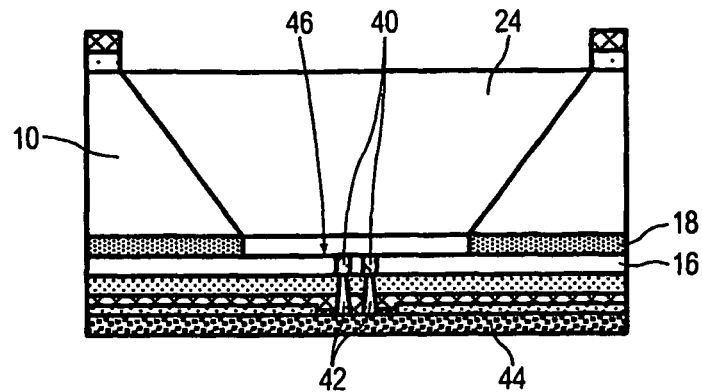
FIG. 9 is an illustrative vertical cross-sectional view of the exemplary embodiment at a ninth stage of the method depicting the removal of the buried oxide layer from the first side by etching and surface reconstruction of SOI.

FIG. 8 shows that by using physical vapor deposition or an equivalent technique, a thin layer 44 of a compatible dielectric film such as, for example, $Si_3N_4$ is deposited onto planar second side surface 14. The layer 44 is to protect the second side 14 as well as the micro and nano-electrode wiring during next step of removal of the buried oxide layer 18 to expose the surface of the thin SOI layer 16. This is shown in FIG. 9, where the buried oxide layer 18 is removed from the first side 12 through the window 24 for the full width and depth of the window 24. Removal may be by wet chemical etching, or its equivalent, in order to expose the portion 46 of the surface of the thin SOI layer 16 of the full width and depth of the window 24. Wet chemical etching may be by, for example, using a buffered hydrofluoric acid. The portion 46 is to be thermally reconstructed to provide an automatically flat and clean surface.

Figure 10:
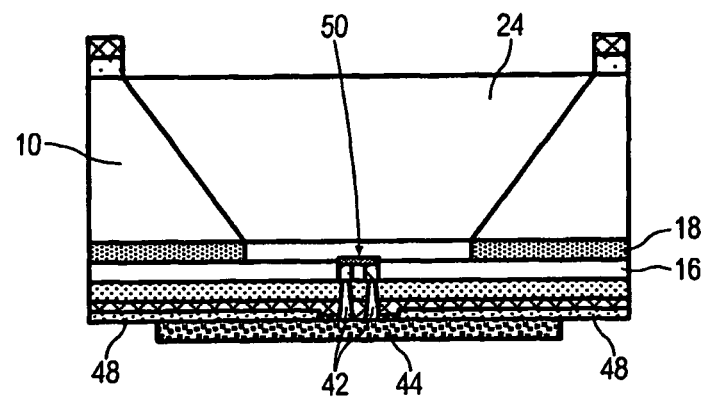
FIG. 10 is an illustrative vertical cross-sectional view of the exemplary embodiment at a tenth stage of the method depicting the backside opening of Au microelectrodes for electrical connection and checking of the SOI front side surface after atomic reconstruction using scanning before the fabrication of the atomic/molecular scale circuit.

In FIG. 10, large contact pads 48 are formed at the outer ends 50 of each micro-electrode 28 by dry etching, or an equivalent technique, on the dielectric film 44 to provide probe landings. The exposed portion 46 of the surface of the SOI layer 16 is cleaned to provide an atomically flat semiconductor surface which can be imaged by an ultra-high vacuum scanning tunneling microscopy ("UHV-STM"). An atomic/molecular/nano-scale circuit 50 is then formed on the doped portions by, for example, STM fabrication.

In this way the metal interconnects 42 are at all times physically supported by the membrane 26, allowing the interconnects 42 to be at the nano scale. Preferably, the interconnects are the same size as the holes 36. The interconnects may be of a diameter in the range 10 to 100 nm, preferably 30 to 50 nm. The interconnects 42 may be somewhat conical as shown, substantially cylindrical, or any other suitable, desired or required shape. A larger area of surface may be conductive by ion implantation through a mask, instead of using FIB over nanoscale areas. The surface patterning process is chemical free. As such there is no coating of the surface with photoresists such as optically active or electron bombardment active chemicals. There is also the ability to pattern from the first and/or second side and have the opposite working side with an atomically clean and flat surface.

Figure 11:
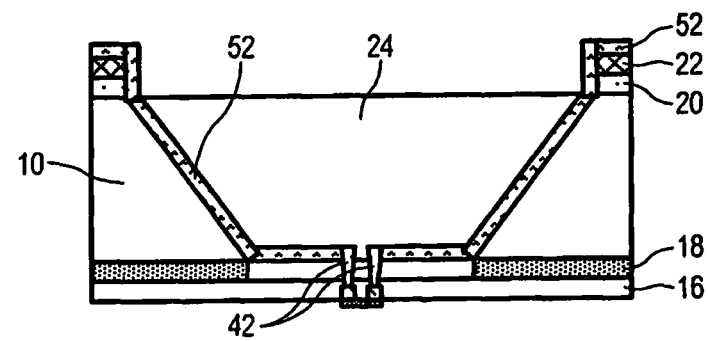
FIG. 11 is an illustrative vertical cross-sectional view of the exemplary embodiment depicting a possible interconnection scheme in which electronic connection to the backside atomic/molecular circuit comes from the first side.

In this regard, and with reference to FIG. 11, the interconnects 42 may be formed through the window 24, with electrodes 52 being formed on the front surface within and through the window 24. The electrodes 52 are formed before hole formation to operatively connect with the interconnects 42.

Also, by interconnecting the atomic and/or molecular devices 50 and circuits from the second side 14 of the supporting wafer 10, and by stopping the interconnects 42 before reaching the first surface 12, the first surface 12 is not transformed and remains as prepared or can be re-prepared. There is no need to perform nanolithography on the top active surface 46 where the atomic and/or molecular circuits 50 will be fabricated. The top surface 46 remains atomically flat. Local doping performed from the second side 14 completes the interconnect 42 without disturbing the preserved flatness of the top active surface 46.

By embedding the metallic interconnects 42 at the second surface 14, the interconnects 42 are rigidified as they form part of the atomic and molecular scale circuit support. This avoids the use of multiple metallic tips addressing devices vertically from the top. The window 24 may be used to package the full atomic and/or molecular circuit 50 by closing the window 24 by wafer bonding. The circuit 50 is then encapsulated in UHV.

Whilst there has been described in the foregoing description exemplary embodiments, it will be understood by those skilled in the technology concerned that many variations in details of design, construction and/or operation may be made without departing from the present invention.

The invention claimed is:

1. A method for forming interconnects from a micron to an atomic scale to interconnect an atomic or molecular circuit at a surface of a substrate, the substrate comprising a semiconductor layer on an oxide layer on a bulk substrate forming a silicon-on-oxide substrate, the semiconductor layer having formed thereon a layer of a thermal oxide and a layer of a dielectric, the method comprising:

opening a window from a first side of the substrate extending to the oxide layer by removing a portion of the bulk substrate to expose the oxide layer, the oxide layer being between the first side and the semiconductor layer;

forming a plurality of buried metal electrodes in the dielectric layer, each buried metal electrode having an inner end, the inner ends facing each other with a gap therebetween; the dielectric remaining between the plurality of buried metal electrodes, and between the inner ends;

forming nano-electrodes on the inner ends and extending towards each other with a nano-gap therebetween;

forming a plurality of holes where the portion of the bulk substrate has been removed into the substrate to the semiconductor layer, the plurality of holes being formed through the nano-electrodes, the dielectric layer and the thermal oxide layer;

and metalizing the plurality of holes to form the interconnects.

2. A method as claimed in claim 1, wherein the holes are formed from a second side of the substrate, the second side being opposite the first side.

3. A method as claimed in claim 1, wherein prior to metallization portions of the semiconductor layer are doped through the plurality of holes.

4. A method as claimed in claim 3, wherein the doping is by use of a focused ion beam.

5. A method as claimed in claim 1, wherein the window is formed after forming the dielectric layer and prior to the buried metal electrodes being formed.

6. A method as claimed in claim 4, wherein a portion of the oxide layer adjacent the doped portions of the semiconductor layer is removed through the window to expose a surface of the semiconductor layer.

7. A method as claimed in claim 6, wherein the circuit is formed on the exposed surface of the semiconductor layer adjacent the doped portions.

8. A method as claimed in claim 1, wherein the window is at least partially filled by wafer bonding to package the circuit.

9. A method as claimed in claim 1, wherein the plurality of holes are formed through the window from an exposed surface of the oxide layer; a plurality of upper electrodes being formed on surfaces of the window from the first side, the holes being formed through the plurality of upper electrodes.

10. A method as claimed in claim 9, wherein the circuit is formed on an exposed surface of the semiconductor layer adjacent the doped portions.

11. A method as claimed in claim 1, wherein a second layer of dielectric is formed over the plurality of buried metal electrodes, the second layer of dielectric being removed from outer ends of the plurality of buried metal electrodes to provide probe landings.

12. A method as claimed in claim 1, wherein the holes are of a diameter in the range 10 to 100 nm.

13. A method as claimed in claim 1, wherein the holes are of a diameter in the range 30 to 50 nm.

14. A method as claimed in claim 1, wherein the interconnects are at all times mechanically supported by the substrate.

15. A method as claimed in claim 1, wherein use of detrimental chemicals is avoided are not used.

16. Interconnects for atomic, molecular and uni-molecular circuits on a substrate, the substrate comprising a semiconductor layer on an oxide layer on a bulk substrate forming a silicon-on-oxide substrate, the semiconductor layer having formed thereon a layer of a thermal oxide and a layer of a dielectric, the substrate further comprising a window formed by removal of a portion of the bulk from a first side of the substrate extending to the oxide layer substrate to expose the oxide layer, the oxide layer being between the first side and the semiconductor layer, there being a plurality of buried metal electrodes in the dielectric layer, each buried metal electrode having an inner end, the inner ends facing each other with a gap therebetween, the dielectric remaining between the plurality of buried metal electrodes, and between the inner ends, nano-electrodes formed on the inner ends and extending towards each other with a nano-gap therebetween, the interconnects comprising:

a plurality of metalized holes formed where the portion of the bulk substrate has been removed in the substrate from a side thereof to doped portions of the semiconductor layer, the doped portions extending through the semiconductor layer, the plurality of holes being formed through the nano-electrodes, the dielectric layer and the thermal oxide layer;

wherein a surface of the semiconductor layer is exposed by removing a portion of the oxide layer adjacent the doped portions of the semiconductor layer through the window, the exposed surface of the semiconductor layer being a flat semiconductor surface.

17. Interconnects as claimed in claim 16, wherein the holes are formed from a second side of the substrate, the second side being opposite the first side.

18. Interconnects as claimed in claim 16, wherein the window is at least partially filled by wafer bonding to package the circuit.

19. Interconnects as claimed in claim 16, wherein the plurality of holes are from an exposed surface of the oxide layer; a plurality of upper electrodes being formed on surfaces of the window from the first side, the holes being through the plurality of upper electrodes.

20. Interconnects as claimed in claim 16 further comprising a circuit on an exposed surface of the semiconductor layer adjacent the doped portions, the circuit being selected from the group consisting of: atomic scale, molecular scale and nano-scale.

21. Interconnects as claimed in claim 16 further comprising a second layer of dielectric over an inner portion of the plurality of buried metal electrodes, the outer ends of the plurality of buried metal electrodes providing probe landings.

22. Interconnects as claimed in claim 16, wherein the holes are of a diameter in the range 10 to 100 nm.

23. Interconnects as claimed in claim 16, wherein the holes are of a diameter in the range 30 to 50 nm.

24. Interconnects as claimed in claim 16, wherein the interconnects are at all times mechanically supported by the substrate.

25. A method for doping a semiconductor layer in a substrate, the substrate comprising a semiconductor layer on an oxide layer on a bulk substrate forming a silicon-on-oxide substrate, the semiconductor layer having formed thereon a layer of a thermal oxide and a layer of a dielectric, the method comprising:

opening a window from a first side of the substrate extending to the oxide layer by removing a portion of the bulk substrate to expose the oxide layer, the oxide layer being between the first side and the semiconductor layer;

forming a plurality of buried metal electrodes in the dielectric layer, each buried metal electrode having an inner end, the inner ends facing each other with a gap therebetween; the dielectric remaining between the plurality of buried metal electrodes, and between the inner ends;

forming nano-electrodes on the inner ends and extending towards each other with a nano-gap therebetween;

forming a plurality of holes where the portion of the bulk substrate has been removed into the substrate to the semiconductor layer, the plurality of holes being formed through the nano-electrodes, the dielectric layer and the thermal oxide layer; and doping portions of the semiconductor layer through the plurality of holes.

26. A method as claimed in claim 25, further comprising subsequently metalizing the plurality of holes to form interconnects.

27. A method as claimed in claim 25, wherein the holes are formed from a second side of the substrate, the second side being opposite the first side.

28. A method as claimed in claim 25, wherein the doping is by use of a focused ion beam.

29. A method as claimed in claim 25, wherein the plurality of holes are formed through the window from an exposed surface of the oxide layer; a plurality of upper electrodes being formed on surfaces of the window from the first side, the holes being formed through the plurality of upper electrodes.

30. A method as claimed in claim 25, wherein a circuit is formed on an exposed surface of the semiconductor layer adjacent the doped portions, the circuit being selected from the group consisting of: atomic scale, molecular scale and nano-scale.

31. A method as claimed in claim 25, wherein the holes are of a diameter in the range 10 to 100 nm.

32. A method as claimed in claim 25, wherein the holes are of a diameter in the range 30 to 50 nm.

* * * * *